US 8,618,856 B1
Dec. 31, 2013

(12) United States Patent
Yeung et al.

(54) SHADOW LATCH

(75) Inventors: Alfred Yeung, Fremont, CA (US); Hamid Partovi, Los Altos, CA (US); John Ngai, Boxborough, MA (US); Ronen Cohen, Sunnyvale, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 13/077,949

(22) Filed: Mar. 31, 2011

(51) Int. Cl.
  *H03K 3/289* (2006.01)

(52) U.S. Cl.
  USPC ............................. 327/202; 327/200; 327/203

(58) Field of Classification Search
  USPC ......................................... 327/200, 202, 203
  See application file for complete search history.

(56) References Cited

U.S. PATENT DOCUMENTS

| | | | |
|---|---|---|---|
| 3,585,410 A | 6/1971 | Burtness | |
| 4,980,577 A | 12/1990 | Baxter | |
| 5,248,905 A | 9/1993 | Kuo | |
| 5,986,962 A | 11/1999 | Bertin et al. | |
| 6,278,308 B1 | 8/2001 | Partovi et al. | |
| 6,433,601 B1 | 8/2002 | Ganesan | |
| 6,657,471 B1 | 12/2003 | Curran | |
| 7,027,345 B2 | 4/2006 | Nedovic et al. | |
| 7,362,154 B2 * | 4/2008 | Mo | 327/203 |
| 7,525,362 B1 | 4/2009 | Lesea | |
| 7,692,466 B2 | 4/2010 | Ahmadi | |
| 7,772,906 B2 | 8/2010 | Naffziger | |
| 7,843,244 B1 | 11/2010 | Tang | |
| 2008/0042713 A1 | 2/2008 | Ahmadi | |
| 2008/0180139 A1 | 7/2008 | Natonio et al. | |
| 2009/0085627 A1 | 4/2009 | Gill et al. | |
| 2009/0256609 A1 | 10/2009 | Naffziger | |
| 2011/0025394 A1 | 2/2011 | Tang | |

* cited by examiner

*Primary Examiner* — John Poos
(74) *Attorney, Agent, or Firm* — Turocy & Watson, LLP

(57) ABSTRACT

A latch device is provided with a driver and a shadow latch. The driver has an input to accept a binary driver input signal, an input to accept a clock signal, and an input to accept a shadow-Q signal. The driver has an output to supply a binary Q signal equal to the inverse of the driver input signal, in response to the driver input signal, the shadow-Q signal, and the clock signal. The shadow latch has an input to accept the driver input signal, and an input to accept the clock signal. The shadow latch has an output to supply the shadow-Q signal equal to the inverted Q signal, in response to the driver input signal and clock signal.

17 Claims, 9 Drawing Sheets

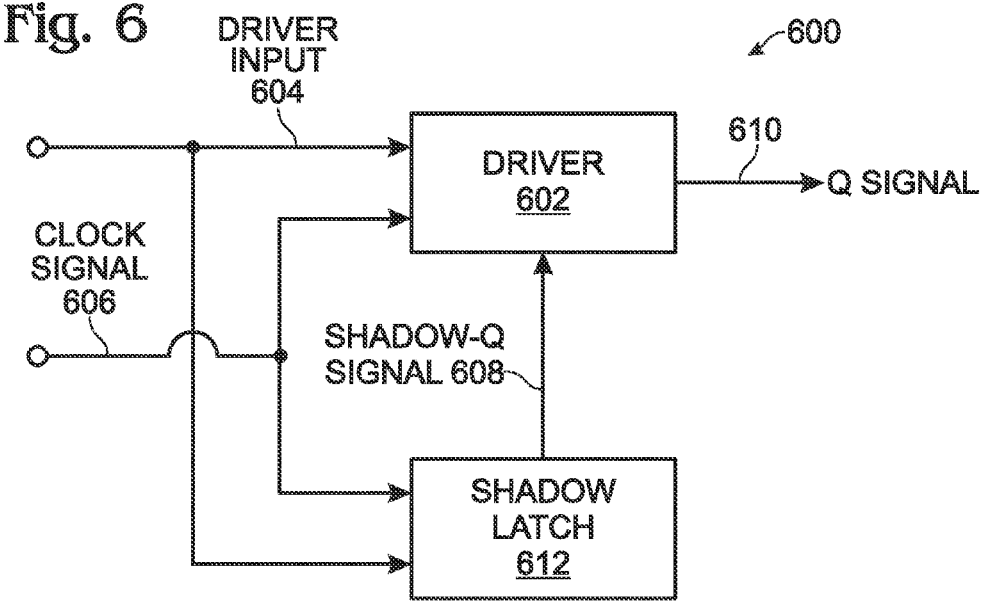
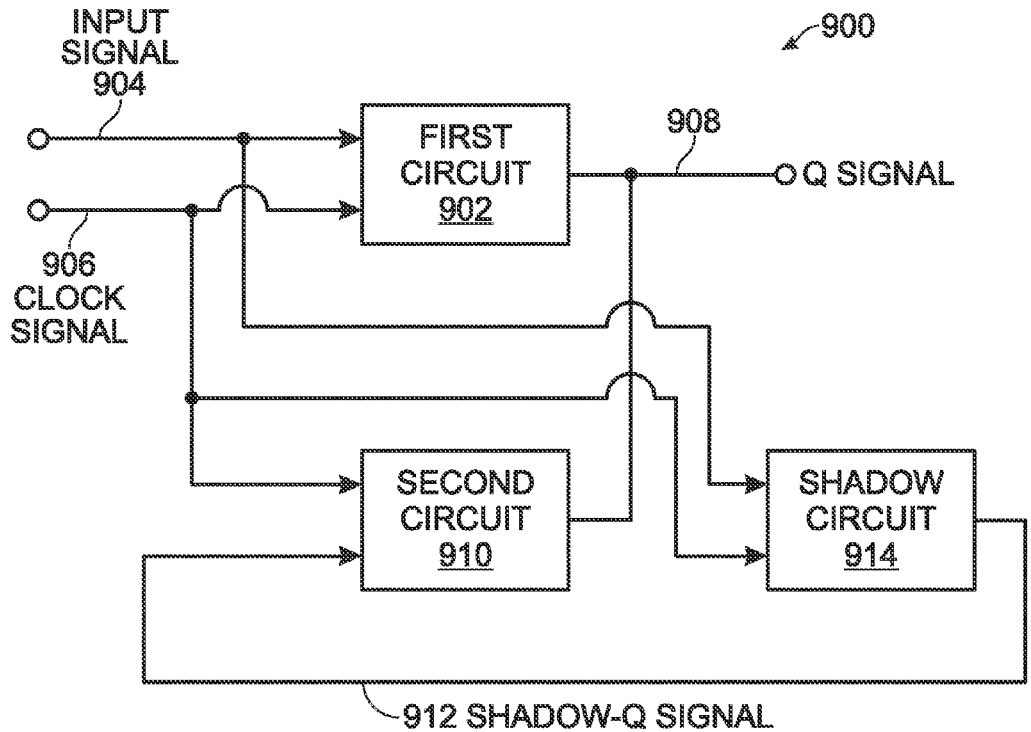

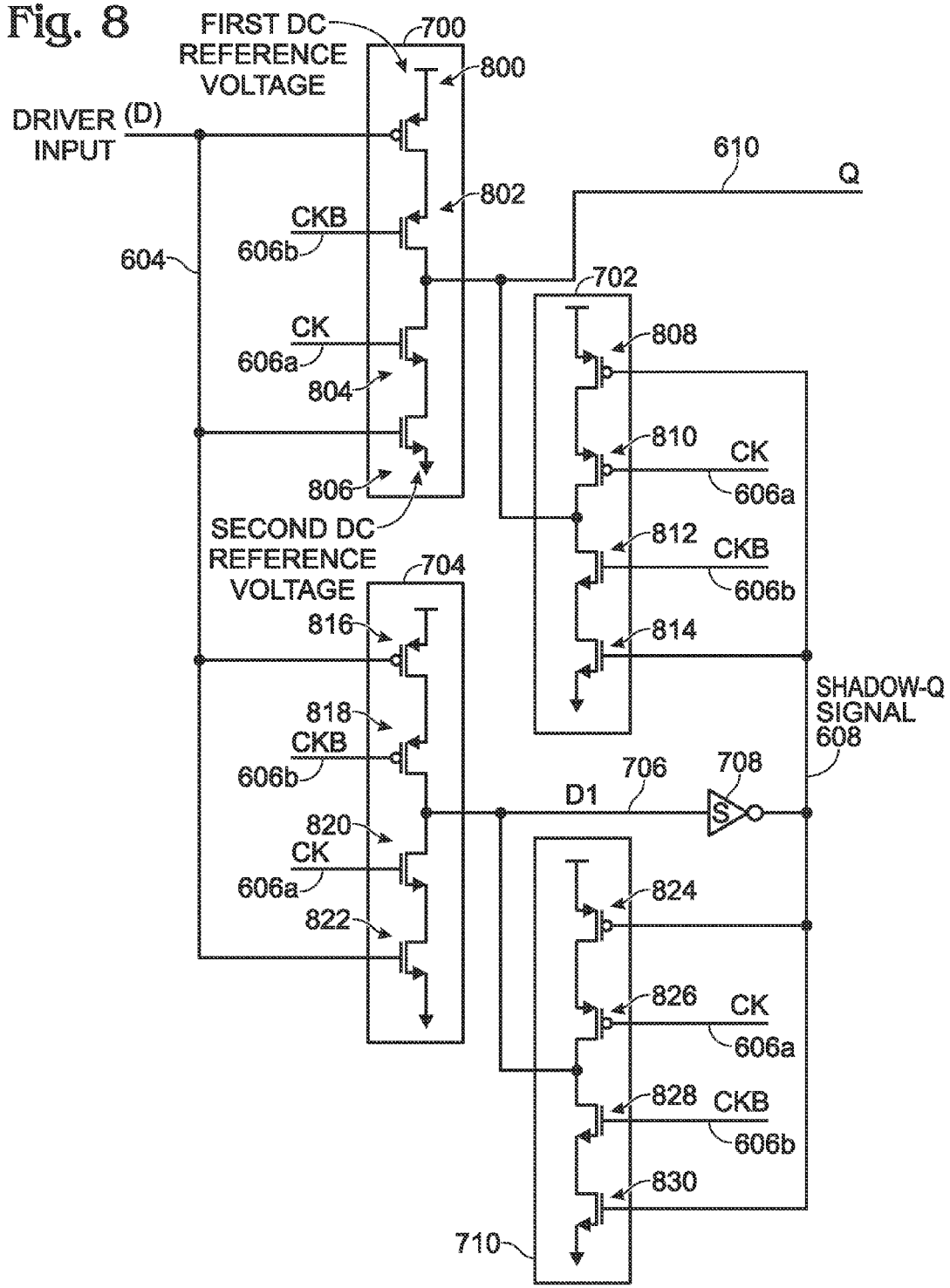

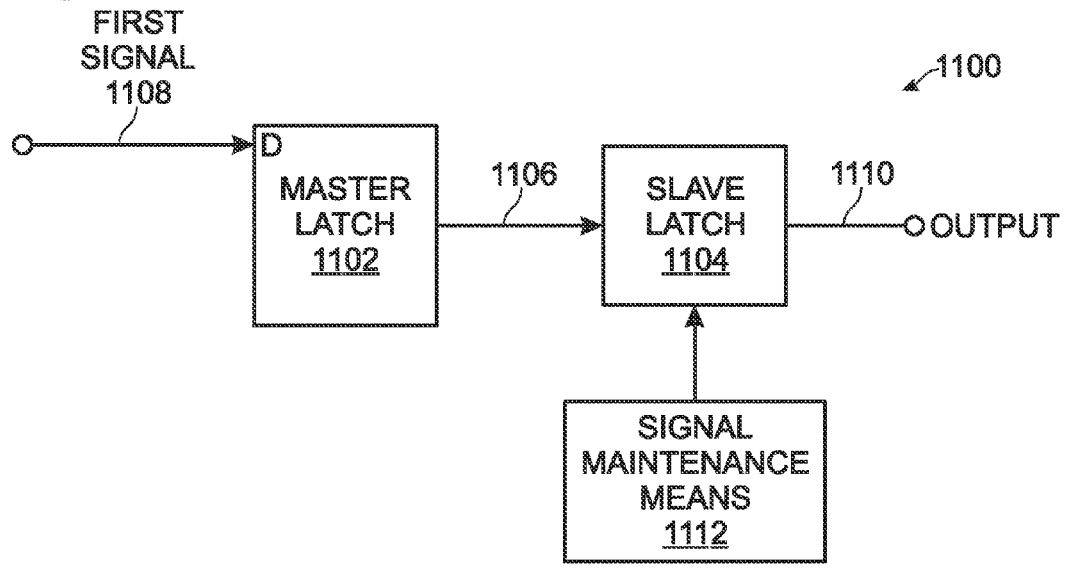
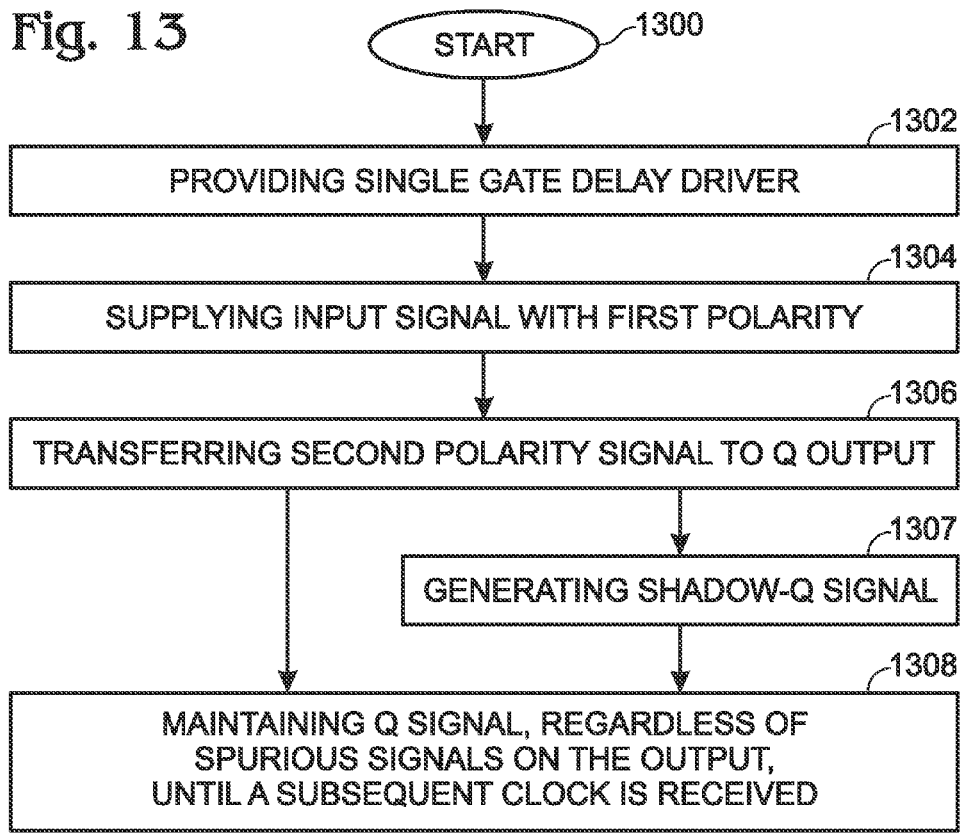

SHADOW LATCH

BACKGROUND OF THE INVENTION

1. Field of the Invention

This invention generally relates to electronic circuitry and, more particularly, to a one-gate delay latch with a shadow stage, which is immune from corruption, to support the latch in its opaque (hold) phase.

2. Description of the Related Art

Whether it is a phase-based design implemented with latches as a fundamental memory element, or edge-based design implemented with back-to-back latches (flip-flops) as the fundamental memory element, latches are an essential building block in modern very large scale integration (VLSI) designs. With conflicting properties of delay, area, power, and robustness, it is difficult to design latches that satisfy all design requirements.

Latches are commonly used in VLSI designs either by themselves or as part of an edge-triggered Flip-Flop (FF) due to their memory holding function. A latch has two phases of operation: in the transparent phase, data flows freely from D to Q, and the amount of time for this to occur is its native delay (Tdq). In the opaque phase, data may toggle on the input D but Q holds its previous value. Which phase the latch operates in is determined by the phase of the clock input (CK). In the context of being an FF building block, there are setup time (Tsu) and clock delay (Tcq) characteristics of the FF. However, those two parameters together form the Tdq native delay, and it is useful to discuss this value as the metric for performance.

FIG. 1 is a schematic diagram of a conventional latch design (prior art). The latch is a clocked state element (from D to D1), which is protected from the output by an inverter (from D1 to Q). This design has the benefit of being simple to understand and extremely robust. However, it has two gate-delay elements, which limits its performance. Note: CK and CKB are opposite phases of a binary clock signal.

FIG. 2 is a schematic diagram of a conventional latch design with improved gate delay (prior art). As an alternative to the design of FIG. 1, the output inverter is removed to provide a faster Tdq. However, this design has a major flaw in that the memory state element is exposed to the output. The memory state is the output value maintained by field effect transistors (FETs) M1, M2, M3, and M4 when the latch is in its opaque phase. When the memory state is protected by the inverter, as in FIG. 1, the effects of any external coupling effects are minimized. When the memory state is exposed, as in FIG. 2, uncontrolled external routes and coupling events can directly affect the feedback loop's ability to maintain the state. If this happens, the memory state becomes corrupted and irrecoverable.

FIG. 3 is a timing diagram contrasting the differences in delay between the circuits of FIG. 1 and FIG. 2. In terms of gate delay, the latch of FIG. 2 is one gate faster than the latch of FIG. 1.

FIG. 4 is a timing diagram depicting the differences in memory state corruption between the circuits of FIG. 1 and FIG. 2. The diagram illustrates a glitch event from external routing upon the output pin Q. If the state-node is exposed as in FIG. 2, an external aggressor net "Agg" can potentially flip the state of the latch. In the design of FIG. 1, a noise event can only produce a glitch on Q instead of flipping the state of the latch.

FIG. 5 is a schematic drawing of a conventional edge-triggered flip-flop (prior art). Edge-triggered flip-flops are commonly used in high-performance synchronous designs due to their robustness and ease of use. A FF is made up of two latches, conventionally described as master and slave latches. As shown, the each latch is based upon the design depicted in FIG. 1. Each of these latches is transparent in alternating clock phases, and this creates the functionality of a FF. The delay characteristics of a FF are described by its delay through the master latch (Tsu), the delay through the slave latch (Tcq) and hold time (Thd). Of the three characteristics, Tsu and Tcq are sometimes combined as the total FF delay (Tdq) to describe the overall delay characteristic of the FF.

The key elements of the flip-flop are its master latch state nodes (MS) and its slave latch state nodes (SS). The state nodes of latches are made up of clocked cross-coupled inverters to provide a feedback loop. This feedback loop maintains the state of this memory element when the latch is opaque. Therefore, these state nodes must be carefully designed to prevent any noise related glitch event from corrupting the state of the latch.

It would be advantageous if a latch could be designed to combine the improved gate delay of the FIG. 2 circuit, with the noise immunity of the FIG. 1 circuit.

SUMMARY OF THE INVENTION

Disclosed herein, is a latch that improves upon a conventional flip-flop design by reducing its delay, without exposing critical memory state nodes to noise. This improvement is achieved at a small price in area and clock loading, while maintaining the conventional logic polarity. The latch permits the fabrication of high-performance design flip-flops, where timing is a critical requirement.

Accordingly, a latch device is provided with a driver and a shadow latch. The driver has an input to accept a binary driver input signal, an input to accept a clock signal, and an input to accept a shadow-Q signal. The driver has an output to supply a binary Q signal equal to the inverse of the driver input signal, in response to the driver input signal, the shadow-Q signal, and the clock signal. The shadow latch has an input to accept the driver input signal, and an input to accept the clock signal. The shadow latch has an output to supply the shadow-Q signal equal to the inverted Q signal, in response to the driver input signal and clock signal.

More explicitly, the driver includes a first clocked inverter circuit having an input to accept the driver input signal, an input to accept the clock signal, and an output to supply the Q signal. The driver also includes a second clocked inverter circuit having an input to accept the shadow-Q signal, an input to accept the clock signal, and an output to supply the Q signal. The shadow latch includes a third clocked inverter circuit having an input to accept the driver input signal, an input to accept the clock signal, and an output to supply a D1 signal. A first inverter has an input to accept the D1 signal and an output to supply the shadow-Q signal. The shadow latch also includes a fourth clocked inverter circuit having an input to accept the shadow-Q signal, an input to accept the clock signal, and an output to supply the D1 signal.

Additional details of the above-described latch device and a method for stabilizing an unbuffered latch are provided below.

BRIEF DESCRIPTION OF THE DRAWINGS

FIG. 6 is a schematic block diagram of a latch device.

FIG. 8 is a schematic block diagram depicting detailed examples of the circuits elements introduced in FIG. 7.

FIG. 9 is a schematic block diagram of a single gate delay latch.

FIG. 11 is a schematic block diagram of a master-slave flip-flop.

FIG. 13 is a flowchart illustrating a method for stabilizing an unbuffered latch.

DETAILED DESCRIPTION

FIG. 6 is a schematic block diagram of a latch device. The latch device 600 comprises a driver 602 having an input on line 604 to accept a binary driver input signal, an input on line 606 to accept a clock signal, and an input on line 608 to accept a shadow-Q signal. The driver has an output on line 610 to supply a binary Q signal equal to the inverse of the driver input signal. The supplied Q signal is responsive to the driver input signal, the shadow-Q signal, and the clock signal. A shadow latch 612 has an input on line 604 to accept the driver input signal, an input on line 606 to accept the clock signal, and an output on line 608 to supply the shadow-Q signal. The shadow-Q signal is equal to an inverted Q signal, and responsive to the driver input signal and clock signal.

Figure 1:
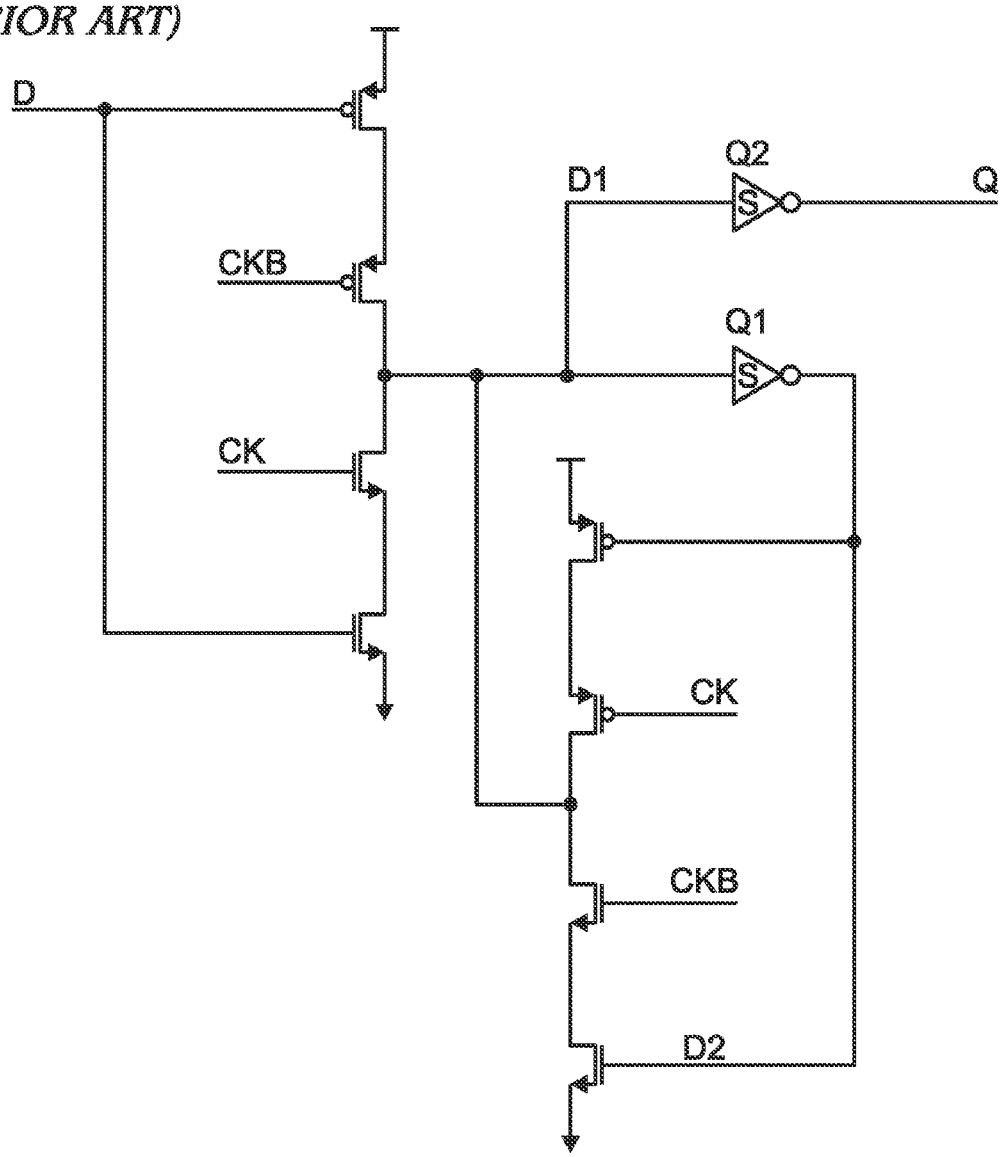
FIG. 1 is a schematic diagram of a conventional latch design (prior art).
Figure 2:
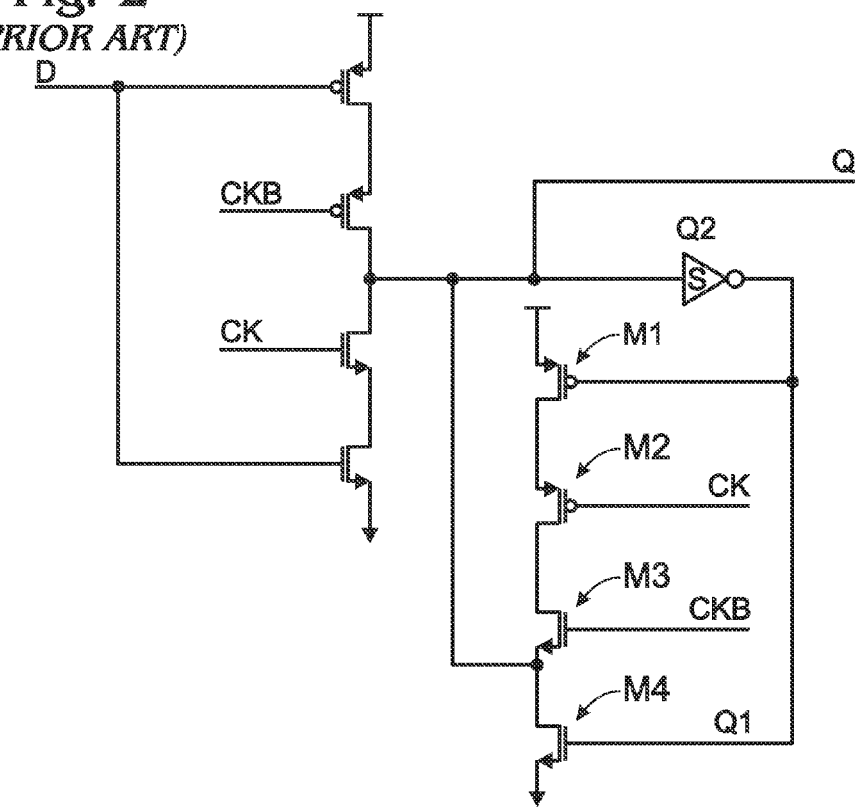
FIG. 2 is a schematic diagram of a conventional latch design with improved gate delay (prior art).
Figure 3:
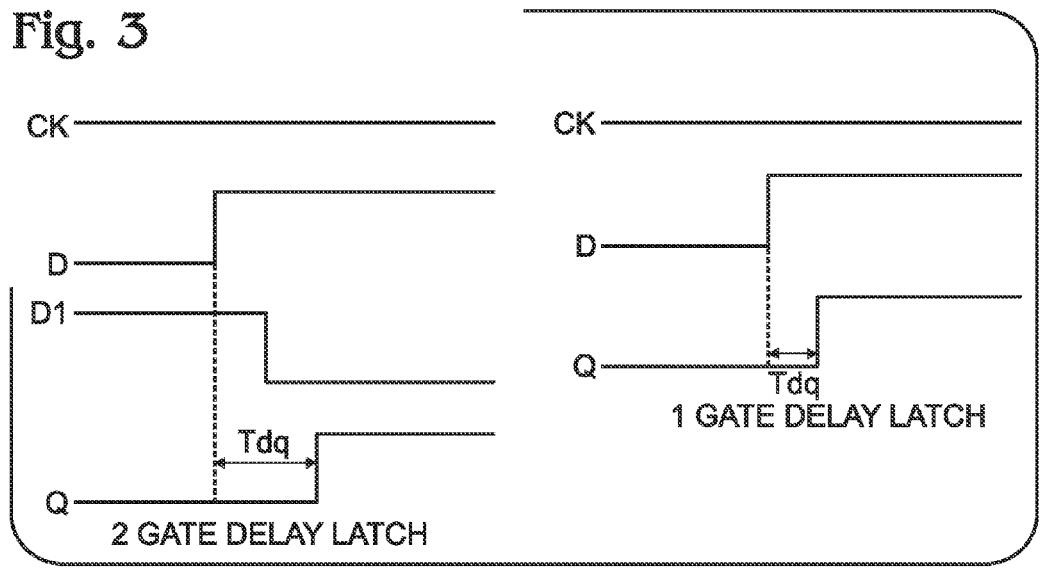
FIG. 3 is a timing diagram contrasting the differences in delay between the circuits of FIG. 1 and FIG. 2.
Figure 4:
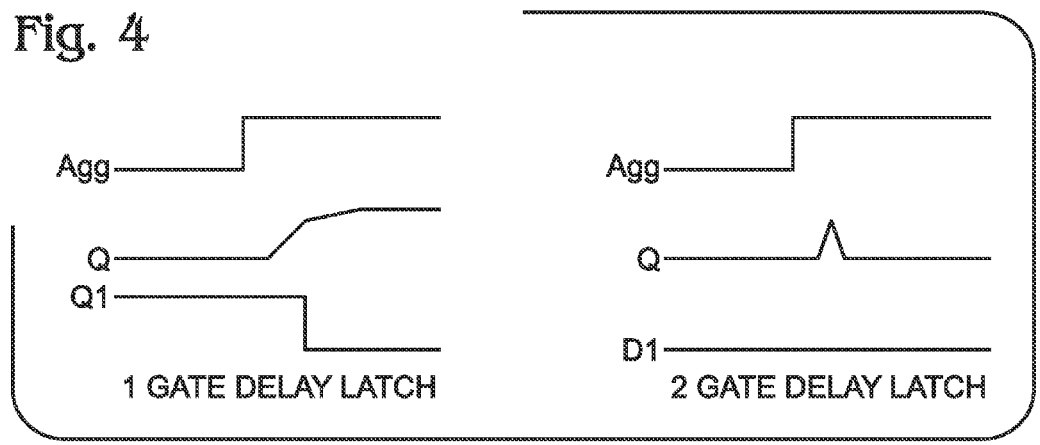
FIG. 4 is a timing diagram depicting the differences in memory state corruption between the circuits of FIG. 1 and FIG. 2.
Figure 5:
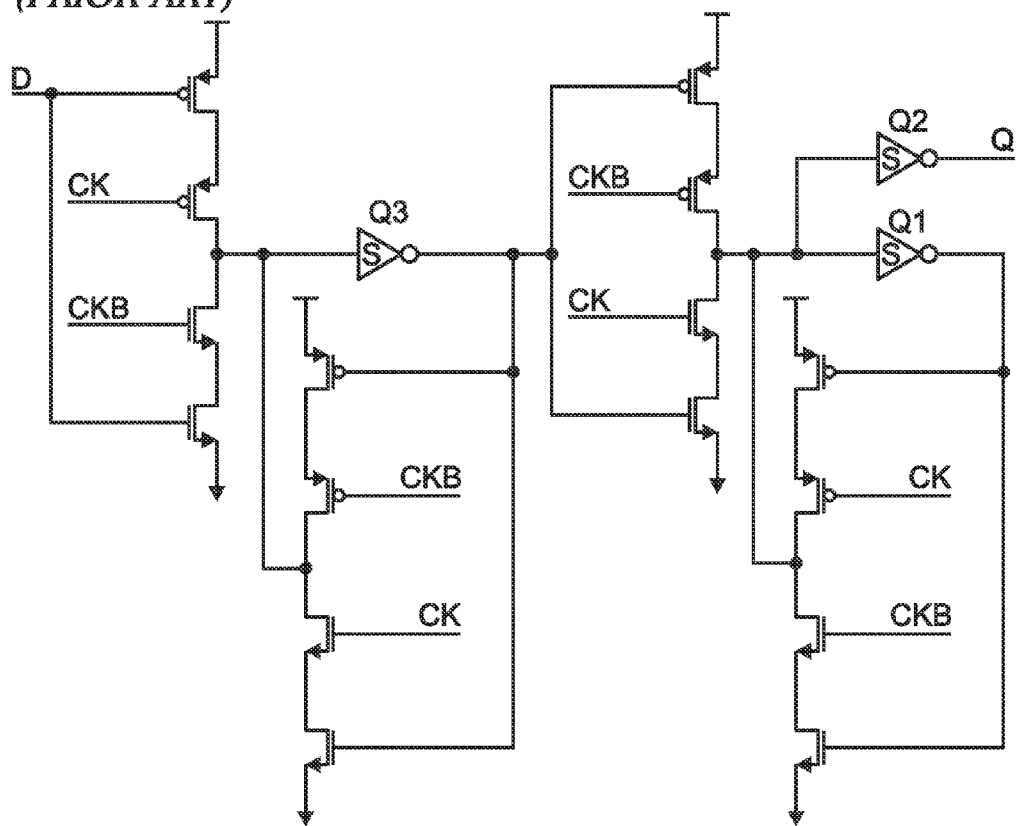
FIG. 5 is a schematic drawing of a conventional edge-triggered flip-flop (prior art).
Figure 7:
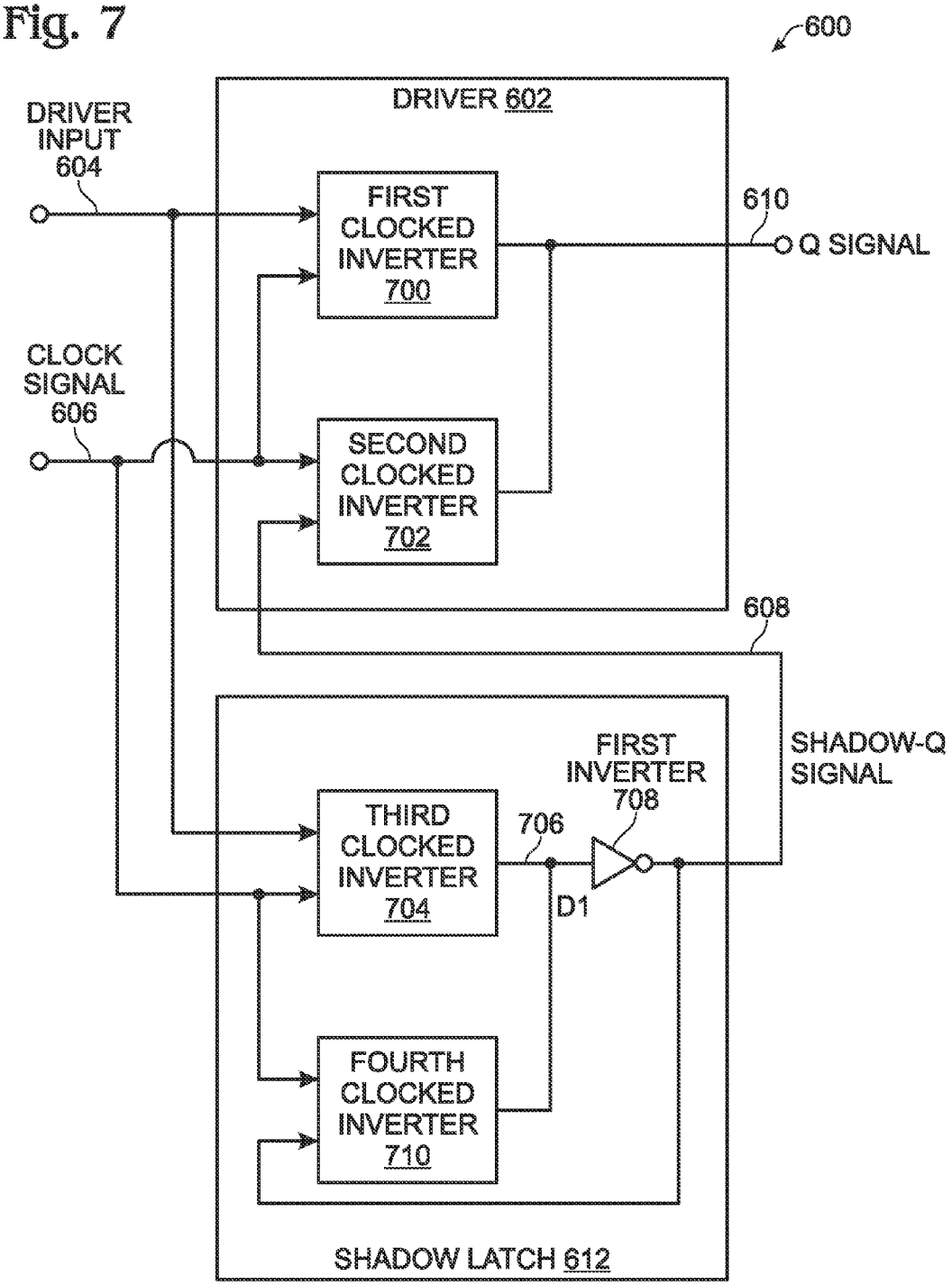
FIG. 7 is a schematic block diagram depicting a detailed example of the latch device shown in FIG. 6.

FIG. 7 is a schematic block diagram depicting a detailed example of the latch device shown in FIG. 6. In this aspect the driver 602 includes a first clocked inverter circuit 700 having an input on line 604 to accept the driver input signal, an input on line 606 to accept the clock signal, and an output on line 610 to supply the Q signal. A second clocked inverter circuit 702 has an input O11 line 608 to accept the shadow-Q signal, an input O11 line 606 to accept the clock signal, and an output on line 608 to supply the Q signal.

The shadow latch 612 includes a third clocked inverter circuit 704 having an input on line 604 to accept the driver input signal, an input on line 606 to accept the clock signal, and an output on line 706 to supply a D1 signal. A first inverter 708 has an input on line 706 to accept the D1 signal and an output on line 608 to supply the shadow-Q signal. A fourth clocked inverter circuit 710 has an input on line 608 to accept the shadow-Q signal, an input on line 606 to accept the clock signal, and an output on line 706 to supply the D1 signal.

The first clocked inverter 700 supplies the Q signal during a first polarity of the clock signal on line 606, and the second clocked inverter 702 supplies the Q signal during a second polarity of the clock signal. Likewise, the third clocked inverter 704 supplies the D1 signal during a first polarity of the clock signal on line 606, and the fourth clocked inverter 710 supplies the D1 signal during a second polarity of the clock signal.

FIG. 8 is a schematic block diagram depicting detailed examples of the circuits elements introduced in FIG. 7. Note: the clock signal has been further differentiated into a first phase CK on line 606a and a second (opposite) phase CKB on line 606b. The 180 degree clock phases may be enabled through the use of an inverter, not shown, or the two phases may be supplied by an external source. In one aspect the first clocked inverter 700 includes a first PMOS field effect transistor (FET) 800 having a first source/drain (S/D) connected to a first dc reference voltage (e.g., a positive voltage), a second S/D, and a gate connected to receive the driver input signal on line 604. A second PMOS FET 802 has a first S/D connected to the second S/D of the first PMOS FET 800, a second S/D to supply the Q signal on line 610, and a gate to receive an inverted clock signal (CKB) on line 606b. A first NMOS FET 804 has a first S/D connected to the second S/D of the second PMOS FET 802, a second S/D, and a gate to receive the clock signal (CK) on line 606a. A second NMOS FET 806 has a first S/D connected to the second S/D of the first NMOS FET 804, a second S/D connected to a second dc reference voltage having a lower potential than the first dc reference voltage (e.g., ground), and a gate to accept the driver input signal on line 604.

The second clocked inverter 702 includes a third PMOS FET 808 having a first S/D connected to the first dc reference voltage, a second S/D, and a gate connected to receive the shadow-Q signal on line 608. A fourth PMOS FET 810 has a first S/D connected to the second S/D of the third PMOS FET 808, a second S/D to supply the Q signal on line 610, and a gate to receive the clock signal on line 606a. A third NMOS FET 812 has a first S/D connected to the second S/D of the fourth PMOS FET 810, a second S/D, and a gate to receive the inverted clock signal on line 606b. A fourth NMOS FET 814 has a first S/D connected to the second S/D of the third NMOS FET 812, a second S/D connected to the second dc reference voltage, and a gate to accept the shadow-Q signal on line 608.

The third clocked inverter 704 includes a fifth PMOS FET 816 having a first S/D connected to the first dc reference voltage, a second S/D, and a gate connected to receive the driver input signal on line 604. A sixth PMOS FET 818 has a first S/D connected to the second S/D of the fifth PMOS FET 816, a second STD to supply the D1 signal on line 706, and a gate to receive the inverted clock signal on line 606b. A fifth NMOS FET 820 has a first S/D connected to the second S/D of the sixth PMOS FET 818, a second S/D, and a gate to receive the clock signal on line 606a. A sixth NMOS FET 822 has a first S/D connected to the second S/D of the fifth NMOS VET 820, a second S/D connected to the second de reference voltage, and a gate to accept the driver input signal on line 604.

The fourth clocked inverter 710 includes a seventh PMOS FET 824 having a first S/D connected to the first de reference voltage, a second S/D, and a gate connected to receive the shadow-Q signal on line 608. An eighth PMOS FET 826 has a first S/D connected to the second S/D of the seventh PMOS FET 824, a second S/D to supply the D1 signal on line 706, and a gate to receive the clock signal on line 606a. A seventh NMOS VET 828 has a first S/D connected to the second S/D of the eighth PMOS FET 826, a second S/D, and a gate to receive the inverted clock signal on line 606b. An eighth NMOS VET 830 has a first S/D connected to the second S/D of the seventh NMOS FET 828, a second S/D connected to the second de reference voltage, and a gate to accept the shadow-Q signal on line 608.

FIG. 9 is a schematic block diagram of a single gate delay latch. The latch 900 comprises a first circuit 902 having an interface on line 904 to accept an input signal with a first binary state, an interface on line 906 to accept a binary clock signal, and an interface on line 908 to supply a Q signal with a second binary state opposite to the first binary state and delayed by a single gate. The first circuit 902 maintains the Q signal second binary state during a first clock polarity.

A second circuit 910 has an interface to accept a shadow-Q signal on line 912, and interface to accept the clock signal on line 906, and an interface to supply the Q signal on line 908. The second circuit maintains the Q signal second binary state during a second clock polarity, opposite to the first polarity. A shadow circuit 914 has an interface to accept the input signal on line 904 with the first binary state, an interface to accept the clock signal on line 906, and an interface to supply the shadow-Q signal on line 912.

Figure 10:
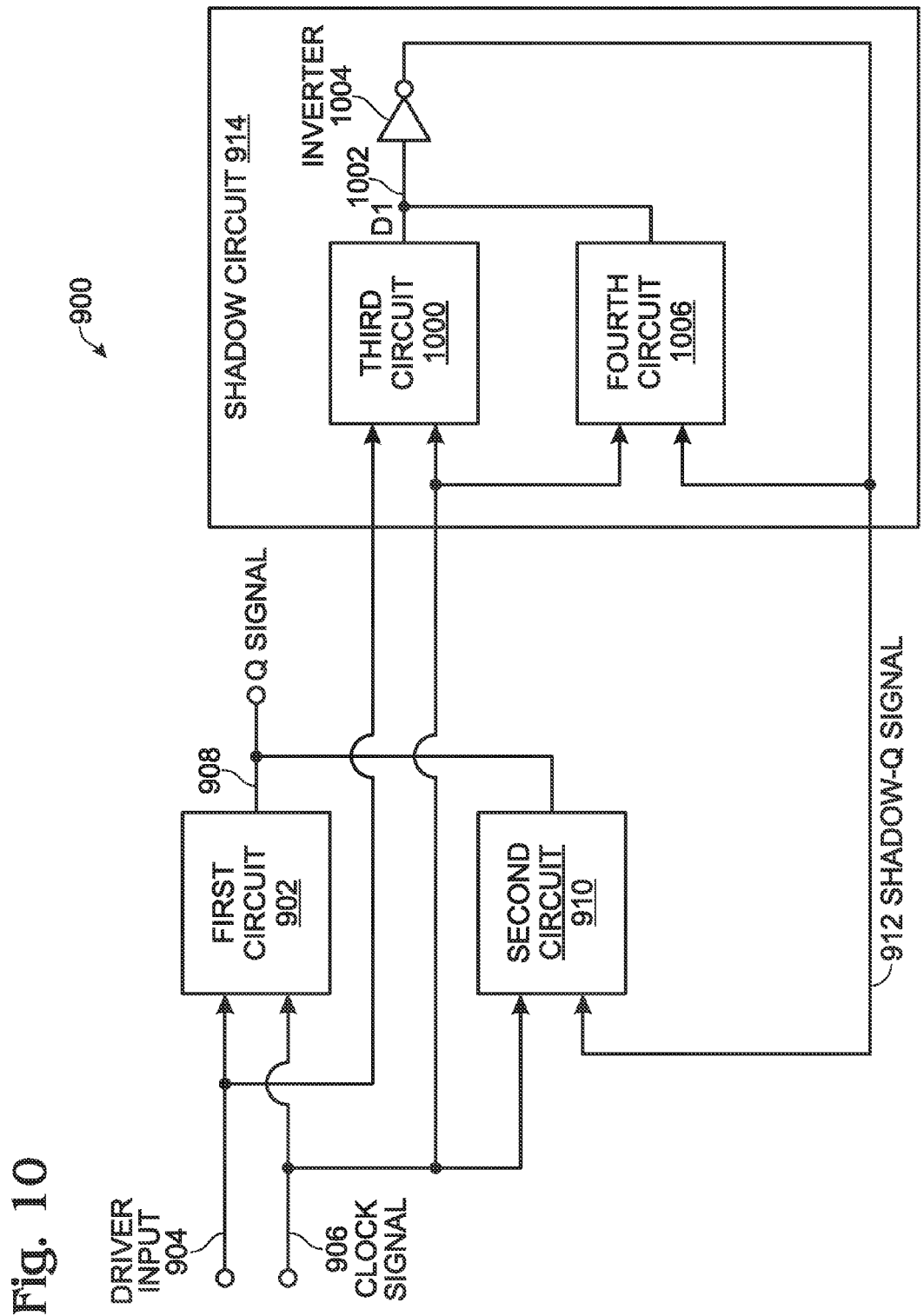
FIG. 10 is a schematic block diagram depicting a detailed example of the shadow circuit of FIG. 9.

FIG. 10 is a schematic block diagram depicting a detailed example of the shadow circuit of FIG. 9. In one aspect the shadow circuit 914 includes a third circuit 1000 having an interface to accept the input signal on line 904 with the first binary state, an interface to accept the clock signal on line 906, and an interface on line 1002 to supply a D signal with the second binary state, delayed by a single gate. The third circuit 1000 maintains the D1 signal second binary state during the first clock polarity. An inverter 1004 has an input to accept the D1 signal on line 1002 and an output to supply the shadow-Q signal on line 912. A fourth circuit 1006 has an interface on line 912 to accept the shadow-Q signal, and interface on line 906 to accept the clock signal, and an interface on line 1002 to supply the D1 signal. The fourth circuit 1006 maintains the D1 signal second binary state during the second clock polarity.

In one aspect, the first circuit 902 and second circuit 910 may be clocked inverters, see FIG. 7. Likewise, the third circuit 1000 and fourth circuit 1006 may be clocked inverters.

FIG. 11 is a schematic block diagram of a master-slave flip-flop. The flip-flop 1100 comprises a single gate delay master latch 1102 series-connected to a single gate delay slave-driver 1104 on line 1106. The master latch 1102 has a D input on line 1108 to accept a binary first signal with a first polarity. Regardless of spurious signals received at the slave latch output on line 1110, the flip-flop includes a means 1112 for maintaining the first signal first polarity at the slave-driver output until a subsequent clock signal is received.

Functional Description

Figure 12:
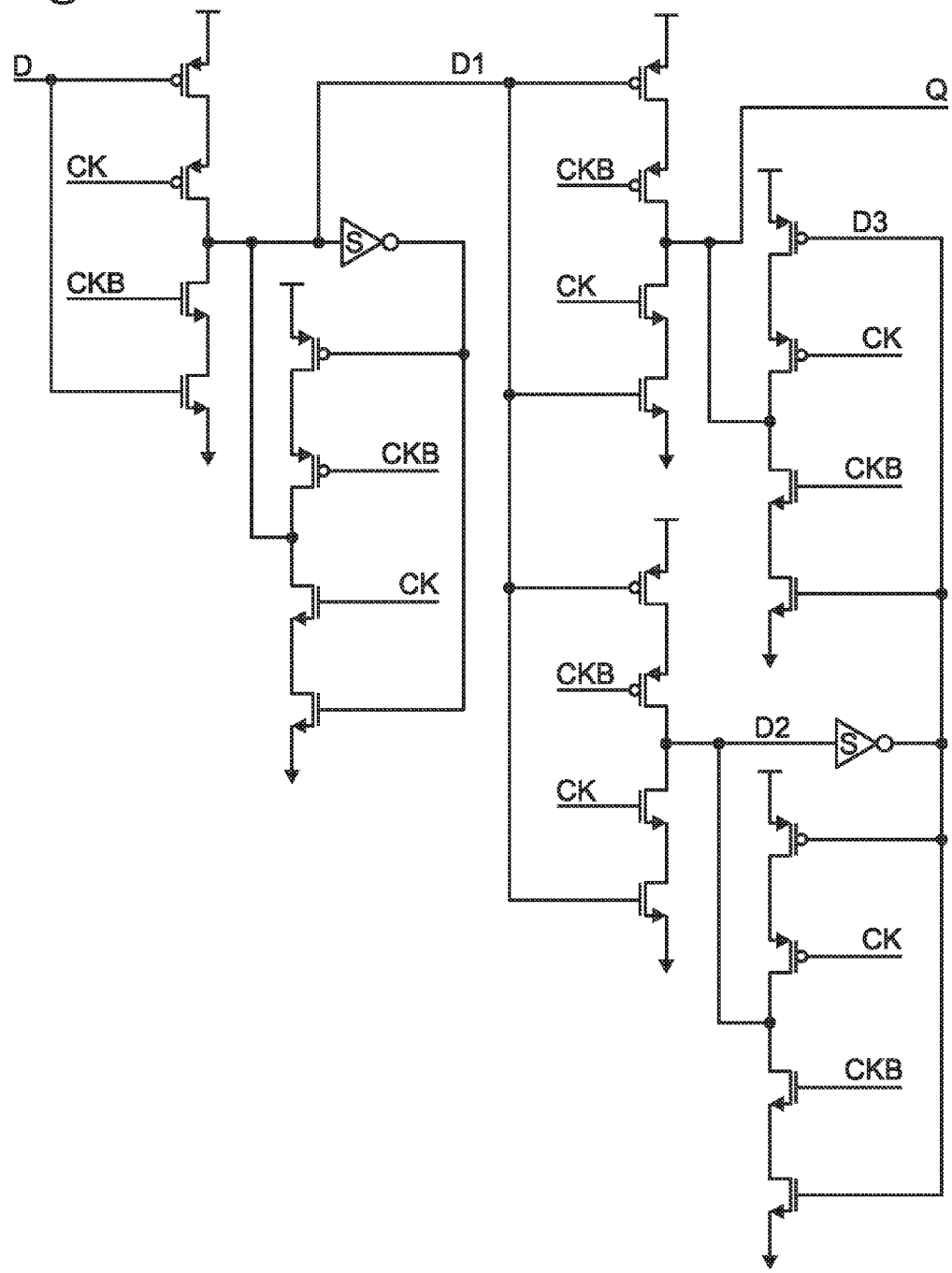
FIG. 12 is a schematic diagram of a two gate delay rising edge-triggered flip-flop with shadow latch.

FIG. 12 is a schematic diagram of a two gate delay rising edge-trigger flip-flop with shadow latch. In this design the benefit of a faster Tdq can be achieved without losing memory state protection. This is done by duplicating the critical delay path that determines Tdq, which is half of the memory state, and using this duplication to directly drive Q. Tdq is determined by this portion of the design, and it involves a single gate delay element. Then, a master latch is built in parallel with the same D input, which holds the state of the latch. Finally, the function of opaque phase latch maintenance is duplicated, and used to drive the output. Although this duplicate path has a high latency, it is a non-critical path and does not have the same delay requirements. However, with this high latency path, memory state has been decoupled from the output, protecting the latch from dangerous coupling and/or glitch events, and making the design robust. With this design, flip-flop performance is improved from four gate delays to two, while maintaining robustness. A similar design could the enabled as a falling edge-triggered flip-flop by reversing the clock polarities.

FIG. 13 is a flowchart illustrating a method for stabilizing an unbuffered latch. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1300.

Step 1302 provides a single gate delay driver. Examples of single gate delay drivers have been presented above. Step 1304 supplies a binary driver input signal, with a first polarity, to an input of the driver. In response to a first clock signal, Step 1306 transfers a second polarity of the driver input signal to a driver (Q) output, with no more than one gate delay. Regardless of spurious signals received at the driver output, Step 1308 maintains the second polarity at the driver (Q) output until a second clock signal is received, subsequent to the first clock signal.

In one aspect, Step 1302 additionally provides a shadow latch. Step 1307 generates a shadow-Q signal in response to the first clock signal. Then, maintaining the second polarity of the driver (Q) output in Step 1308 includes maintaining the second polarity in response to the shadow-Q signal. In another aspect, generating the shadow-Q signal in Step 1307 includes generating the shadow-Q signal decoupled from the driver (Q) output.

In one aspect, providing the driver and shadow latch in Step 1302 includes providing the driver with a clocked transfer inverter output (Q) connected to a clocked hold inverter output. Referencing the example of FIG. 7, the clocked transfer inverter may be the first clocked inverter 700 and the clocked hold inverter may the second clocked inverter 702. Step 1302 provides the shadow latch with a clocked transfer inverter (e.g., third clocked inverter 704) driving a clocked hold inverter's feedback input. For example, the shadow latch clocked hold inverter may be the fourth clocked inverter 710. Then, maintaining the second polarity of the driver (Q) output in Step 1308 includes supplying the shadow-Q signal to an input of the driver clocked hold inverter.

A single gate delay latch has been provided. Examples of particular circuits, such as clocked inverters, have been presented to illustrate the invention. However, the invention is not limited to merely these examples. Other variations and embodiments of the invention will occur to those skilled in the art.

We claim:

1. A latch device comprising:
   a driver comprising
   an input to accept a binary driver input signal,
   an input to accept a clock signal,
   an input to accept a shadow-Q signal, and
   an output to supply a binary Q signal equal to an inverse of the driver input signal, in response to the driver input signal, the shadow-Q signal, and the clock signal,
   a first clocked inverter circuit having an input to accept the driver input signal, an input to accept the clock signal, and an output to supply the Q signal, and
   a second clocked inverter circuit having an input to accept the shadow-Q signal, an input to accept the clock signal, and an output to supply the Q signal; and
   a shadow latch having an input to accept the driver input signal, an input to accept the clock signal, and an output to supply the shadow-Q signal equal to an inverted Q signal, in response to the driver input signal and clock signal.

2. The circuit device of claim 1 wherein the shadow latch comprises:
   a third clocked inverter circuit having an input to accept the driver input signal, an input to accept the clock signal, and an output to supply a D1 signal;

a first inverter having an input to accept the D1 signal and an output to supply the shadow-Q signal; and, a fourth clocked inverter circuit having an input to accept the shadow-Q signal, an input to accept the clock signal, and an output to supply the D1 signal.

3. The circuit device of claim 2 wherein the first clocked inverter comprises:
a first PMOS field effect transistor (FET) having a first source/drain (S/D) connected to a first do reference voltage, a second S/D, and a gate connected to receive the driver input signal;
a second PMOS FET having a first S/D connected to the second S/D of the first PMOS FET, a second S/D to supply the Q signal, and a gate to receive an inverted clock signal;
a first NMOS FET having a first S/D connected to the second S/D of the second PMOS FET, a second S/D, and a gate to receive the clock signal; and,
a second NMOS FET having a first S/D connected to the second S/D of the first NMOS FET, a second S/D connected to a second dc reference voltage having a lower potential than the first do reference voltage, and a gate to accept the driver input signal;
wherein the second clocked inverter comprises:
a third PMOS FET having a first S/D connected to the first dc reference voltage, a second S/D, and a gate connected to receive the shadow-Q signal;
a fourth PMOS FET having a first S/D connected to the second S/D of the third PMOS FET, a second S/D to supply the Q signal, and a gate to receive the clock signal;
a third NMOS FET having a first S/D connected to the second S/D of the fourth PMOS FET, a second S/D, and a gate to receive the inverted clock signal; and,
a fourth NMOS FET having a first S/D connected to the second S/D of the third NMOS FET, a second S/D connected to the second do reference voltage, and a gate to accept the shadow-Q signal.

4. The circuit device of claim 3 wherein the third clocked inverter comprises:
a fifth PMOS FET having a first S/D connected to the first dc reference voltage, a second S/D, and a gate connected to receive the driver input signal;
a sixth PMOS FET having a first S/D connected to the second S/D of the fifth PMOS FET, a second S/D to supply the D1 signal, and a gate to receive the inverted clock signal;
a fifth NMOS FET having a first S/D connected to the second S/D of the sixth PMOS FET, a second S/D, and a gate to receive the clock signal; and,
a sixth NMOS FET having a first S/D connected to the second S/D of the fifth NMOS FET, a second S/D connected to the second dc reference voltage, and a gate to accept the driver input signal;
wherein the fourth clocked inverter comprises:
a seventh PMOS FET having a first S/D connected to the first dc reference voltage, a second S/D, and a gate connected to receive the shadow-Q signal;
an eighth PMOS FET having a first S/D connected to the second S/D of the seventh PMOS FET, a second S/D to supply the D1 signal, and a gate to receive the clock signal;
a seventh NMOS FET having a first S/D connected to the second S/D of the eighth PMOS FET, a second S/D, and a gate to receive the inverted clock signal; and,
an eighth NMOS FET having a first S/D connected to the second S/D of the seventh NMOS FET, a second S/D connected to the second dc reference voltage, and a gate to accept the shadow-Q signal.

5. The circuit device of claim 2 wherein the third clocked inverter supplies the D1 signal during the first polarity of the clock signal; and,
wherein the fourth clocked inverter supplies the D1 signal during the second polarity of the clock signal.

6. The circuit device of claim 1 wherein the first clocked inverter supplies the Q signal during a first polarity of the clock signal; and,
wherein the second clocked inverter supplies the Q signal during a second polarity of the clock signal.

7. A method for stabilizing an unbuffered latch, comprising:
providing a single gate delay driver;
supplying a binary driver input signal, with a first polarity, to an input of the driver;
in response to a first clock signal, transferring a second polarity of the driver input signal to a driver (Q) output, with no more than one gate delay;
regardless of spurious signals received at the driver output, maintaining the second polarity at the driver (Q) output until a second clock signal is received, subsequent to the first clock signal, wherein maintaining the second polarity of the driver (Q) output comprises maintaining the second polarity in response to the shadow-Q signal; and
generating a shadow-Q signal in response to the first clock signal, wherein generating the shadow-Q signal comprises generating the shadow-Q signal decoupled from the driver (Q) output.

8. The method of claim 7 wherein providing the driver and shadow latch comprises providing the driver with a clocked transfer inverter output (Q) connected to a clocked hold inverter output and providing the shadow latch with a clocked transfer inverter driving a clocked hold inverter's feedback input; and,
wherein maintaining the second polarity of the driver (Q) output comprises supplying the shadow-Q signal to an input of the driver clocked hold inverter.

9. A single gate delay latch comprising:
a first circuit having an interface to accept an input signal with a first binary state, an interface to accept a binary clock signal, and an interface to supply a Q signal with a second binary state opposite to the first binary state and delayed by a single gate, the first circuit maintaining the Q signal second binary state during a first clock polarity;
a second circuit having an interface to accept a shadow-Q signal, and interface to accept the clock signal, and an interface to supply the Q signal, the second circuit maintaining the Q signal second binary state during a second clock polarity, opposite to the first polarity, wherein the second circuit is a clocked inverter; and,
a shadow circuit having an interface to accept the input signal with the first binary state, an interface to accept the clock signal and an interface to supply the shadow-Q signal.

10. A master-slave flip-flop comprising:
the single gate delay master latch of claim 9 series-connected to a single gate delay slave-driver, the master latch having a D input to accept a binary first signal with a first polarity; and,
regardless of spurious signals received at the slave latch output, a means for maintaining the first signal first polarity at the slave-driver output until a subsequent clock signal is received.

11. The latch of claim 9 wherein the first circuit is a clocked inverter; and,
wherein the second circuit is a clocked inverter.

12. The latch of claim 9 wherein the shadow circuit comprises:
- a third circuit having an interface to accept the input signal with the first binary state, an interface to accept the clock signal, and an interface to supply a D1 signal with the second binary state, delayed by a single gate, the third circuit maintaining the D1 signal second binary state during the first clock polarity;
- an inverter having an input to accept the D1 signal and an output to supply the shadow-Q signal; and,
- a fourth circuit having an interface to accept the shadow-Q signal, and interface to accept the clock signal, and an interface to supply the D1 signal, the fourth circuit maintaining the D1 signal second binary state during the second clock polarity.

13. The latch of claim 12 wherein the third circuit is a clocked inverter; and,
wherein the fourth circuit is a clocked inverter.

14. A single gate delay latch comprising:
- a first circuit having an interface to accept an input signal with a first binary state, an interface to accept a binary clock signal, and an interface to supply a Q signal with a second binary state opposite to the first binary state and delayed by a single gate, the first circuit maintaining the Q signal second binary state during a first clock polarity;
- a second circuit having an interface to accept a shadow-Q signal, and interface to accept the clock signal, and an interface to supply the Q signal, the second circuit maintaining the Q signal second binary state during a second clock polarity, opposite to the first polarity; and,
- a shadow circuit having an interface to accept the input signal with the first binary state, an interface to accept the clock signal, and an interface to supply the shadow-Q signal, the shadow circuit comprises:
  - a third circuit having an interface to accept the input signal with the first binary state, an interface to accept the clock signal, and an interface to supply a D1 signal with the second binary state, delayed by a single gate, the third circuit maintaining the D1 signal second binary state during the first clock polarity;
  - an inverter having an input to accept the D1 signal and an output to supply the shadow-Q signal; and,
  - a fourth circuit having an interface to accept the shadow-Q signal, and interface to accept the clock signal, and an interface to supply the D1 signal, the fourth circuit maintaining the D1 signal second binary state during the second clock polarity.

15. The latch of claim 14 wherein the first circuit is a clocked inverter and the second circuit is a clocked inverter.

16. The latch of claim 14 wherein the third circuit is a clocked inverter and the fourth circuit is a clocked inverter.

17. A master-slave flip-flop comprising:
- the single gate delay master latch of claim 14 series-connected to a single gate delay slave-driver, the master latch having a D input to accept a binary first signal with a first polarity; and,
- regardless of spurious signals received at the slave latch output, a means for maintaining the first signal first polarity at the slave-driver output until a subsequent clock signal is received.

* * * * *